(12) United States Patent
Ogata et al.

(10) Patent No.: US 6,733,243 B2
(45) Date of Patent: May 11, 2004

(54) METHOD OF INTERBAY TRANSPORTATION

(75) Inventors: Ryoji Ogata, Tokyo (JP); Hirofumi Ohtsuka, Itami (JP); Taichi Yanaru, Itami (JP)

(73) Assignees: Renesas Technology Corp., Tokyo (JP); Ryoden Semiconductor System Engineering Corporation, Itami (JP)

( * ) Notice: Subject to any disclaimer, the term of this patent is extended or adjusted under 35 U.S.C. 154(b) by 146 days.

(21) Appl. No.: 10/115,009

(22) Filed: Apr. 4, 2002

(65) Prior Publication Data
US 2003/0108407 A1 Jun. 12, 2003

(30) Foreign Application Priority Data
Oct. 18, 2001 (JP) ........................................ 2001-321092

(51) Int. Cl.$^7$ ............................... B65H 1/00; B65G 1/00
(52) U.S. Cl. ........................ 416/806; 414/217; 414/270
(58) Field of Search ................................. 414/270, 217, 414/222, 269, 800, 806, 935, 937, 940, 786, 223

(56) References Cited

U.S. PATENT DOCUMENTS

| | | | | |
|---|---|---|---|---|
| 5,024,570 A | * | 6/1991 | Kiriseko et al. | 414/222 |
| 6,246,923 B1 | * | 6/2001 | Sugimura et al. | 414/217 |
| 6,356,804 B1 | * | 3/2002 | Conboy et al. | 414/940 |
| 6,417,014 B1 | * | 7/2002 | Lam et al. | 414/935 |

FOREIGN PATENT DOCUMENTS

| | | |
|---|---|---|
| JP | 8-339497 | 12/1996 |
| JP | 10-94947 | 4/1998 |
| JP | 11-263403 | 9/1999 |

* cited by examiner

Primary Examiner—Eileen D. Lillis
Assistant Examiner—R. B. Johnson
(74) Attorney, Agent, or Firm—Leydig, Voit & Mayer, Ltd.

(57) ABSTRACT

An interbay transportation system includes bays in which process equipment are provided, stockers provided for the individual bays, and a vehicle traveling through the stockers for transporting a semi-processed product from one of the stockers to another. Timing to start transportation is determined according to the operation status of the process equipment and the number of semi-processed products in the stocker.

2 Claims, 9 Drawing Sheets

METHOD OF INTERBAY TRANSPORTATION

FIELD OF THE INVENTION

The present invention relates to an interbay transportation system for transporting a semi-processed product from a previous process step to the next process step (i.e. from one bay to another bay) in a manufacturing plant. More particularly, the present invention relates to an interbay transportation system that includes stockers (or storage shelves) for individual process steps to allow process-waiting and transportation-waiting, and transport pods (or cassettes) containing semi-processed products conveyed from the stocker for a previous process step and to the stocker for the next process step.

BACKGROUND OF THE INVENTION

A semiconductor product, such as a semiconductor memory or a microprocessor, is produced in a procedure in which many elements such as transistors and capacitors as well as wirings connecting the elements are finely and precisely formed on a semiconductor wafer having a diameter of 200 to 300 mm, the wafer is cut into individual products, and the individual cut-out products are encapsulated by resin. Thus, formation of the elements and wirings on the semiconductor wafer is significantly important for manufacturing semiconductor products, and is carried out through various and many process steps.

In each of the aforementioned process steps, a dedicated manufacturing apparatus (hereinafter referred to as process equipment) is used. As such, an interbay transportation system is necessary to transport a semiconductor wafer completed in processing by the process equipment in a previous step to the process equipment in the next process step.

Hereinafter, an example of such interbay transportation system will be described with reference to FIG. 1.

Generally, in a semiconductor-product manufacturing plant, a plurality of rooms (each of which will be referred to as a bay) are provided in a clean room, and a plurality of process equipment are provided in each of the bays. In the example shown in FIG. 1, six bays (bay 1 to bay 6) are provided in a clean room, and three or four pieces of equipment are provided in each of the bays (for example, process equipment 11, 12 and 13 for the bay 1).

An OHS (Over Head Shuttle) 8 is provided to perform transportation between bays, that is, interbay transportation. The OHS 8 is configured to include a guide rail circularly visiting the individual bays, and OHS vehicles 80 travelling along the guide rail. A plurality of semiconductor wafers (for example, 25 pieces) are housed in one pod, loaded onto the OHS vehicle 80, and carried from one bay to another. Ordinarily, a plurality of the pods (for example, 2 pods) can be loaded onto the OHS vehicle 80.

A storage shelf (which will be referred to as a stocker) is provided for each of the bays to receive from the OHS vehicle the pod (semiconductor wafers) that is to be processed in the bay, and to hand a process-completed pod to the OHS vehicles. In the example shown in FIG. 1, stockers 10 to 60 are provided for the respective bays 1 to 6.

Hereinafter, a practical interbay transportation will be described using FIG. 2.

A pod (semiconductor wafers) to be processed by process equipment 11 is loaded onto an OHS vehicle 80 and transported to a bay 1. Then, the pod is stored in a stocker 10 for the bay 1 (see an arrow 101 in FIG. 2). An intrabay transportation system, which is provided in the bay 1, takes out the pod from the stocker 10, and then feeds it into the process equipment 11 (see an arrow 102 in FIG. 2). Upon completion of processing in the process equipment 11, the intrabay transportation system returns the process-completed pod to the stocker 10 (see an arrow 103 in FIG. 2).

Subsequently, the process-completed pod is transported to the next process step. Description is made hereinbelow assuming that process equipment 53 executes the next process step. An OHS 8 transports the process-completed pod to a bay 5, and the pod is stored into a stocker 50 (see an arrow 104 in FIG. 2). An intrabay transportation system in the bay 5 takes out the pod from the stocker 50, and then feeds it into the process equipment 53 (see an arrow 105 in FIG. 2). Upon completion of processing in the process equipment 53, the intrabay transportation system returns the process-completed pod to the stocker 50 (see an arrow 106 in FIG. 2).

The OHS 8 takes out the process-completed pod from the stocker 50, and then transports the pod to a stocker 20 for the next process step (see an arrow 107 in FIG. 2). Thereafter, in the same manner, transportation of a pod (semiconductor wafers) and processing in the process equipment are iterated, thereby allowing the manufacture of semiconductor products to proceed.

In the interbay transportation system described above, a request is issued to cause the pod to be transported to the next process step (for example, the stocker 50) when the process-completed pod in the previous process equipment is returned to a stocker (for example, the stocker 10). In response, the OHS vehicle travels to the stocker 10, receives the pod, and then transports the pod to the stocker 50.

At this time, the stocker 50 may be full for some reasons. That is, pods to be processed by process equipment in the bay 5 are increased, or process equipment(s) in the bay 5 has malfunctioned. In such a case, when a free space for one pod occurs, transportation from the stocker 10 to the stocker 50 is immediately started. Therefore, non-urgent transportation takes place and hinders high-urgency transportation. Furthermore, the full loading capacity of the OHS vehicle cannot be used up, so that the transportation efficiency is reduced.

In addition, as has already been described, although the OHS vehicle has the capacity of transporting the plurality of pods, a transportation request is issued in units of one pod. Therefore, unless processing for the second pod is timely completed, the OHS vehicle transports only a single pod, and thereby, the transportation efficiency is also reduced. If the transportation request is issued after completion of processing of the second pod to avoid the problem, a wait time can occur in process equipment of the next step because the pod is not timely transported thereto, thereby reducing the operation rate of the process equipment.

SUMMARY OF THE INVENTION

In order to solve the above-described problems, an interbay transportation system of the present invention includs bays in which process equipment are provided, stockers provided for the individual bays, and a vehicle traveling through the stockers for transporting a semi-processed product from one of the stockers to another, and is characterized in that timing to start transportation is determined according to the operation status of the process equipment and the number of semi-processed products in the stocker.

Moreover, an interbay transportation system according to the present invention includes bays in which process equipment are provided, stockers provided for the individual bays, and a vehicle traveling through the stockers for transporting a semi-processed product from one of the stockers to another, and furthermore, a buffer stocker in which a semi-processed product is temporary shelved.

Further, a method of interbay transportation according to the present invention is associated with an interbay transportation system including bays in which process equipment are provided, stockers provided for the individual bays, and a vehicle capable of loading a plurality of semi-processed products. Semi-processed products are transported from a stocker of a bay including process equipment for a previous process step to a stocker for a bay including process equipment for the next process step by the vehicle. In the method of the present invention, a comparison is performed between a time by completion of processing in the process equipment in the next process step and a time of transportation between the stockers. Following the result of the comparison, transportation by the vehicle is awaited until the time by completion of processing becomes equal to the time of transportation between the stockers. During a period of the awaiting, another semi-processed product that was completed in processing in the previous process step may be returned to the stocker for the previous process step. Therefore, by transporting the pod which is returned to the stocker during a period of the awaiting together with the first pod, the efficiency in transportation is improved.

A method of interbay transportation according to the present invention is associated with an interbay transportation system including bays in which process equipment are provided, stockers provided for the individual bays, and a vehicle capable of loading a plurality of semi-processed products. Semi-processed products are transported from a stocker of a bay including process equipment for a previous process step to a stocker of a bay including process equipment for the next process step by the vehicle. In the method of the present invention, the status of the process equipment for the next process step is detected. In case where the process equipment for the next process step is not operating, a semi-processed product completed in processing in the previous process step is transported only one time from the stocker for the previous process step to the stocker for the next process step. A semi-processed product to follow is kept to stay in the stocker for the previous process step. Therefor, the problem in which the stocker for the next process step is jammed up with the process-waiting pods does not arise.

A method of interbay transportation according to the present invention is associated with an interbay transportation system including bays in which process equipment are provided, stockers provided for the individual bays, a buffer stocker in which a semi-processed product is temporary shelved, and a vehicle capable of loading a plurality of semi-processed products. Semi-processed products are transported from a stocker of a bay including process equipment for a previous process step to a stocker for a bay including process equipment for the next process step by the vehicle. In the method of the present invention, the status of the process equipment for the next step and/or the status of the stocker for the next step are detected. In the case where the process equipment for the next process step is not operating or in the case where the stocker for the next process step is full, a semi-processed product to be transported to the stocker for the next process step is temporarily shelved in the buffer stocker. Therefor, the problem in which the stocker for the previous process step is jammed up with the transportation-waiting pods does not arise.

A method of interbay transportation according to the present invention is associated with an interbay transportation system including bays in which process equipment are provided, stockers provided for the individual bays, a buffer stocker in which a semi-processed product is temporary shelved, and a vehicle capable of loading a plurality of semi-processed products. Semi-processed product are transported from a stocker of a bay including process equipment for a previous process step to a stocker for a bay including process equipment for the next process step by the vehicle. In the method of the present invention, the number of semi-processed products in the stocker for the next process step is detected. In the case where the number of semi-processed products in the stocker for the next process step is equal to or larger than a prescribed number, a time until the number of semi-processed product in the stocker for the next process step becomes smaller than the prescribed number is determined. Moreover, a difference in required time between detour transportation via the buffer stocker and direct transportation without the buffer stocker is also determined. When the time until the number of semi-processed products becomes smaller than the predetermined number is longer than the time difference between detour and direct transportation, a semi-processed product is transported to the buffer stocker. Therefore, it is possible to minimize the detour transportation, so that efficiency in transportation is enhanced.

According to the present invention, a pod can be kept awaiting in a stocker of a previous process step as long as possible without having process equipment of the next process step waiting for a pod. Therefore, it becomes possible to collect pods at the stocker of the previous step, so that efficiency in transportation is enhanced by transporting thus collected pods at once.

In addition, according to the present invention, a pod awaiting transportation to the next process step does not reside, for example, on an OHS vehicle or in the previous process step. Consequently, the OHS vehicle can be efficiently used to improve the transportation efficiency, and in addition, carry-in/carry-out operations are not hindered at the previous process step.

Furthermore, according to the present invention, a stocker in the next process step is not caused to be full with pods awaiting re-operation of process equipment. Consequently, another pod that uses the same stocker is not hindered from being fed into process equipment. Moreover, since at least one pod is secured in a stocker in the next process step, the pod can be quickly fed, and processing can be quickly started after the process equipment has started operation. Furthermore, the transportation efficiency can be improved by not using a redundant transportation route via the buffer stocker.

Still furthermore, an optimum transportation route can be selected from a route of direct transportation from a stocker in a previous process step to a stocker in the next process step and a route of detour transportation via the buffer stocker.

These and other objects, advantages and features of the present invention will become more apparent from the following description and the accompanying drawings.

DETAILED DESCRIPTION

Hereinafter, embodiments of the present invention will be described referring to the accompanying drawings.

Embodiment 1

Hereinafter, an embodiment of the present invention will be described using FIGS. 1 to 4.

Figure 1:
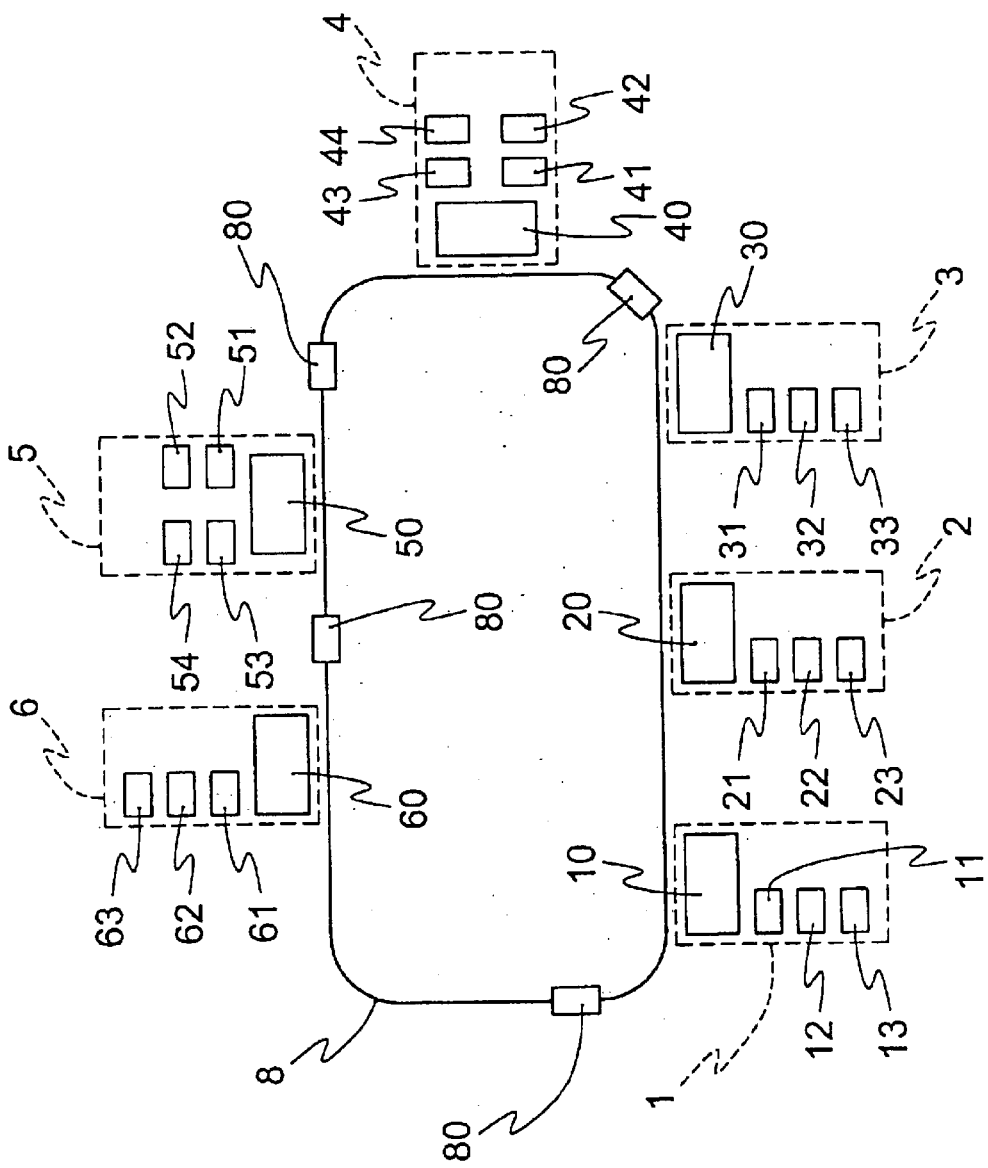
FIG. 1 is a schematic representation of an interbay transportation system.
Figure 2:
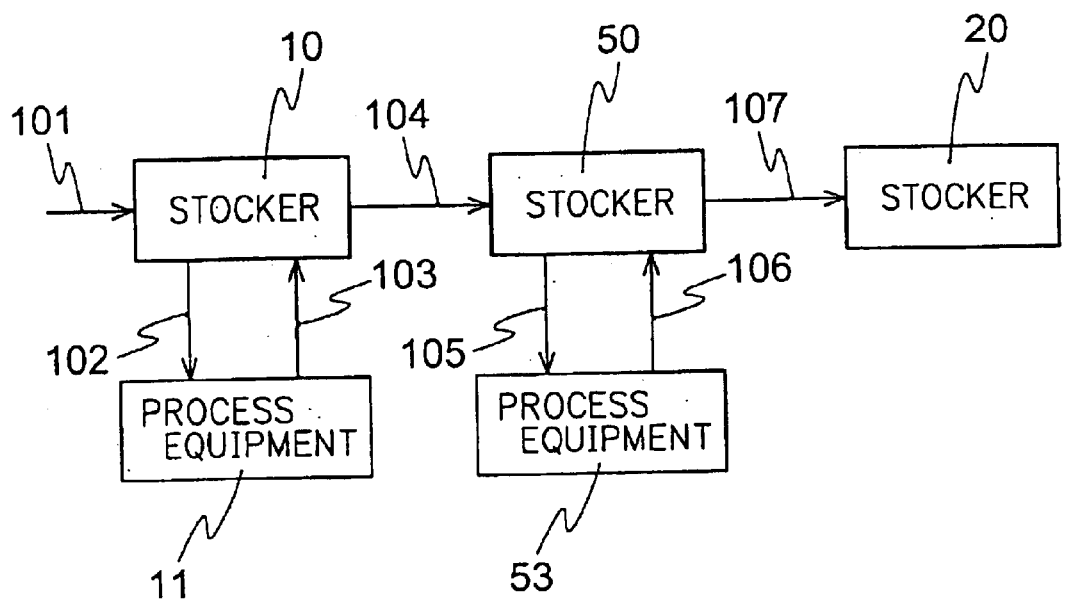
FIG. 2 is a schematic representation showing an interbay transportation.

As shown in FIG. 1, an interbay transportation system of the present embodiment includes bays 1 to 6 in which process equipment are individually provided, stockers 10 to 60 provided for the individual bays, and an OHS 8 travelling these stockers. Ordinarily, the OHS 8 includes a plurality of OHS vehicles 80. Each of the OHS vehicles 80 is loaded with a pod(s) containing semiconductor wafers and performs inter-stocker transportation. In addition, a host computer for controlling system operations is provided in the interbay transportation system.

Figure 3:
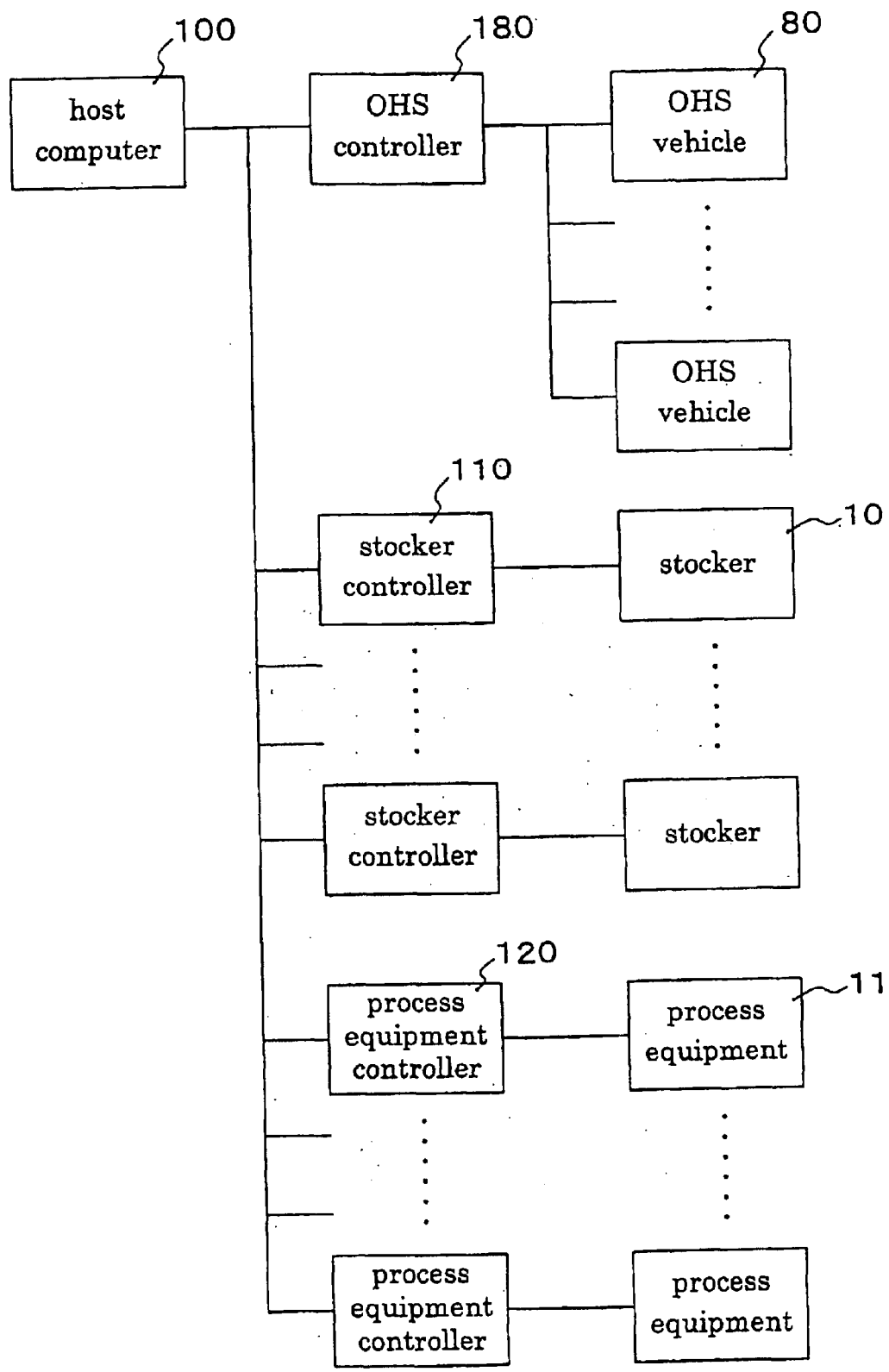
FIG. 3 is a schematic block diagram showing a relation between a host computer and controllers according to the present invention.

As shown in FIG. 3, an OHS controller 180, stocker controllers 110, and process equipment controllers 120 are connected to a host computer 100. The OHS controller 180 is used to control traveling of the OHS vehicles 80. The stocker controllers 110 are provided for each stocker to control operations of the stocker, such as carry-in and carry-out operations, and to send to the host computer 100 information on a pod (semiconductor wafers) carried into or carried out from the stocker. The process equipment controllers 120 are provided for each process equipment to acquire the status of the process equipment, for example, operation/non-operation and a progress of the process, and to appropriately send the acquired information to the host computer 100.

Based on the information from the stocker controllers and the process equipment controllers, the host computer 100 is enabled to verify statuses of individual pods, such as locations thereof and progress of the processes. Accordingly, with an arrangement in which process step flow (e.g. required processings and the execution order thereof) for each pod are stored in a database, the host computer 100 is enabled to identify where a pod should be subsequently transported. Thereby, the host computer 100 is enabled to control the OHS vehicle through the OHS controller 180 to transport the pod to an appropriate stocker. Alternatively, the process step flow may be recorded in each pod by using, for example, a barcode, a magnetic card, and an engraved/projected pattern formed on a surface thereof. The recorded data is read out at the stocker, and the read out data or the part of the read out data indicating the next destination of the pod is sent to the host computer.

Figure 4:
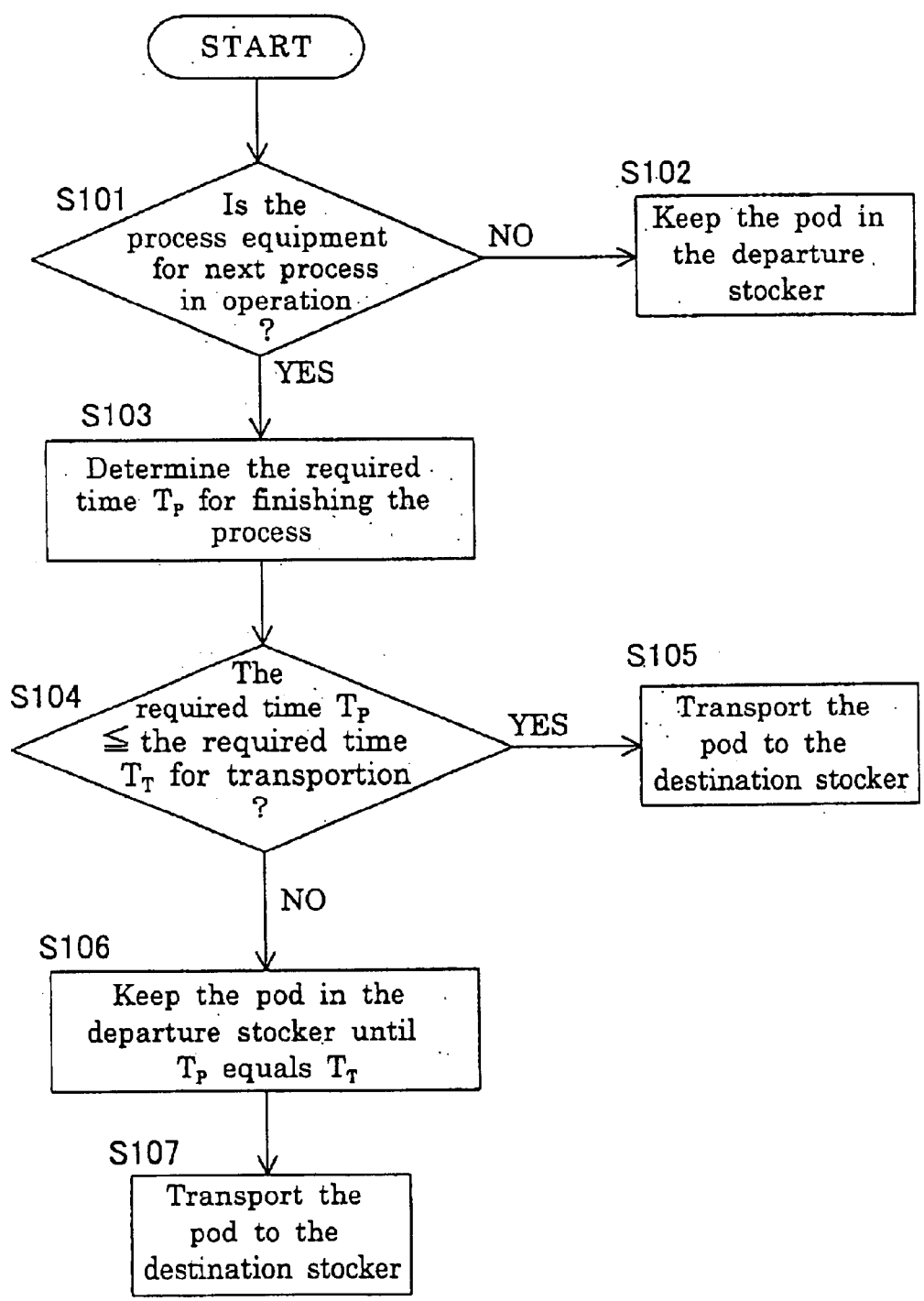
FIG. 4 is a flow chart showing a method of interbay transportation according to the present invention.

Hereinafter, operation of the interbay transportation system according to the present embodiment will be described with reference to a flowchart shown in FIG. 4. The operation will be described on the assumption that the pod (wafers) is processed in the process steps shown in FIG. 2, that is, the pod is first processed by the process equipment 11, and is then processed by the process equipment 53. In the description made hereinafter, since the pod is transported from the stocker 10 to the stocker 50, the stocker 10 is referred to as a "departure stocker", and the stocker 50 is referred to as a "destination stocker".

First, the pod completed in processing by the process equipment 11 is returned to the stocker 10. Information representing that the pod has returned is sent to the host computer 100 from the stock controller of the stocker 10. At step S101 of FIG. 4, the host computer 100 having received the information inquires the process equipment controller 120 as to whether the process equipment 53 for the next process step is operating. In this case, the arrangement may of course be made such that the process equipment controller 120 preliminarily sends information on the operation/non-operation status of the process equipment 53, and the host computer 100 stores the information.

When the process equipment 53 is not operating, even if a pod is transported thereto, the pod is only stored in the stocker 50, but no other significant things can be achieved. Hence, the pod is kept in a standby state in the departure stocker (stocker 10) as shown in step S102 of FIG. 4.

On the other hand, when the process equipment 53 is operating, the host computer 100 verifies the time $T_P$ for finishing a process currently in execution in the process equipment 53 based on the information acquired through the process equipment controller 120 (step S103).

In step S104, subsequently, the host computer 100 computes a required time $T_T$ for transportation from the stocker 10 to the stocker 50, and performs a comparison between the transportation-requiring time $T_T$ and the process completion time $T_P$ of the process equipment 53, which has been verified in step S103. The transportation-requiring time $T_T$ includes times required for carry-out operation of a pod from the stocker 10, loading operation of the pod onto the OHS vehicle 80, unloading operation of the pod from the OHS vehicle 80 and carry-in operation of the pod to the stocker 50 in addition to a time for travel from stocker 10 to stocker 50. The transportation-requiring time $T_T$ may be additionally includes a necessary time for sending a OHS vehicle 80 to the stocker 10, in which the necessary time is computed based on the current position of the OHS vehicle 80 which is acquired through the OHS controller 180.

If the time by the process completion (the required time $T_P$) is shorter than the transportation-requiring time (the required time $T_T$), the host computer 100 issues a command of causing the pod to be immediately transported (step S105). The OHS vehicle 80 then transports the pod to the stocker 50.

If the time by the process completion (the required time $T_P$) is longer than the transportation-requiring time (the required time $T_T$), the host computer 100 controls the pod to be set in a standby state in the departure stocker until the time by the process completion becomes equal to the transportation-requiring time (step S106).

In the standby period, a different pod that was in process in the process equipment 11, 12, or 13 of the bay 1 is completed in processing and may be returned to the stocker 10. In a case the pod additionally completed in processing is scheduled to be processed by process equipment in the bay 5, the host computer 100 issues a command of controlling the standby pod and the additional pod to be transported to the destination stocker, that is, the stocker 50 in a batch (step S107). The OHS vehicle 80 then transports these pods to the stocker 50.

In a case where three or more pods can be loaded onto the OHS vehicle 80, completion in processing of still another pod to follow may be awaited. Moreover, in the case where processing of the subsequent pod has not been completed during the standby period of step S106, or in the case where the destination stocker is different while processing of the subsequent pod has been completed, the OHS vehicle transports the standby pod solely to the stocker 50 at step S107.

As described above, in the present embodiment, a verification is performed for the process completion time of the process equipment in the next process step, and based on the verification result, a determination is made as to whether the pod completed in processing in the previous process step needs to be transported promptly.

According to the above, pod can be kept in a standby state at the departure stocker as long as possible without awaiting of the process equipment for the next process caused by non-arrival of a pod. By transporting pods stored during the standby time in a batch, the transportation efficiency is improved.

As already described, ordinarily, the OHS 8 includes the plurality of OHS vehicles 80. As such, the nearest OHS vehicle among the plurality of OHS vehicles 80 is used to travel to the departure stocker, that is, an OHS vehicle that can arrive at the departure stocker in the shortest time is used for transportation. In case where the nearest OHS vehicle is already reserved, that is, the nearest OHS vehicle is on a way to the destination stocker with a pod or the nearest OHS vehicle is on a way to the departure stocker to receive a pod, a second nearest OHS vehicle is used for the transportation.

In addition, a case is conceivable in which a plurality of routes are available for the transportation from the departure stocker to the destination stocker as in a case where two guide rails are provided for clockwise and counterclockwise traveling respectively, or a case where junctions and a bypass rail are provided. In such a case, an OHS vehicle for transportation may be selected in a manner such that the distance up to the destination stocker via the departure stocker is shortest.

Embodiment 2

A case is conceivable in which when a pod completed in processing in a previous process step is to be transported, since a stocker in the next process step is full, transportation is impossible. Therefore, the present embodiment is characterized in that a buffer stocker is provided to temporarily preserve the pod.

Hereinafter, an interbay transportation system of the present embodiment will be described using FIGS. 5 and 6.

Figure 5:
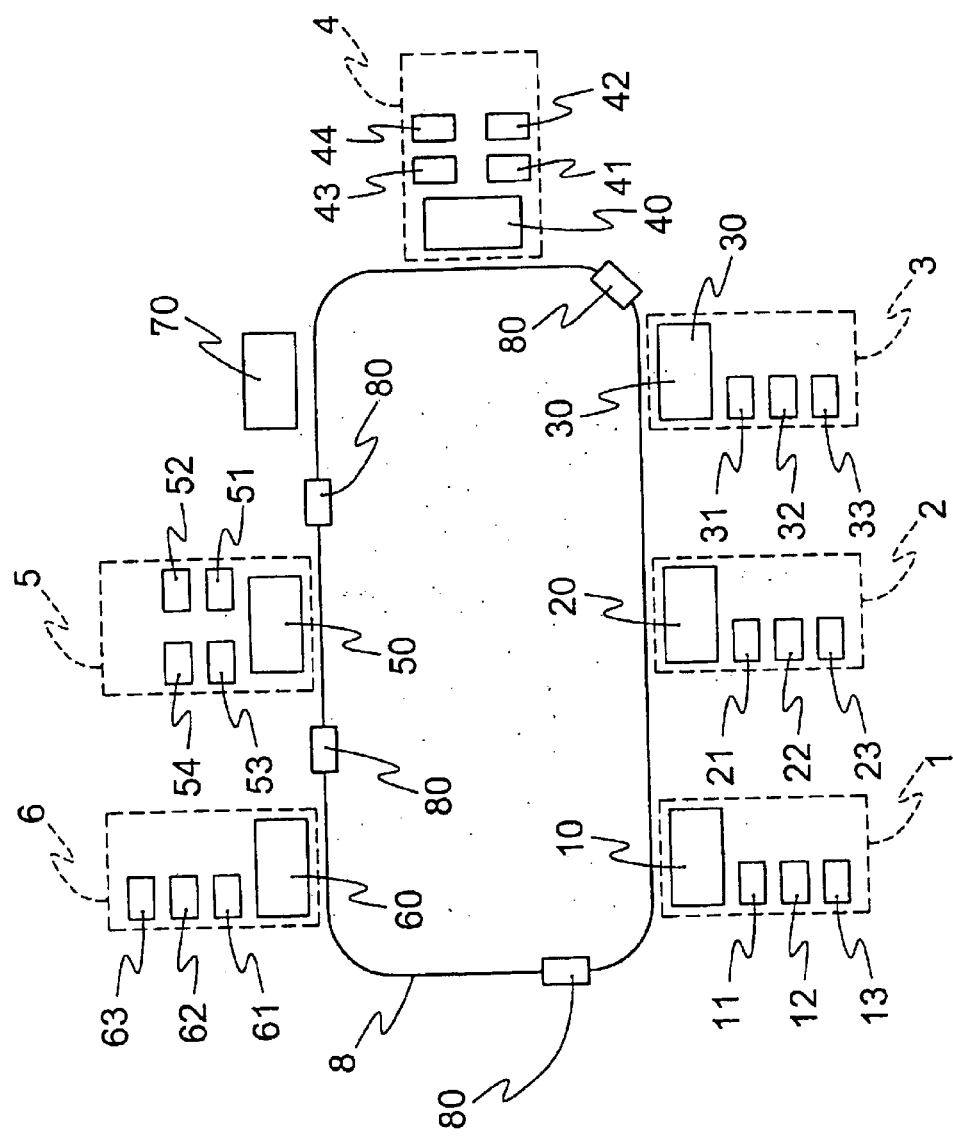
FIG. 5 is a schematic representation of an interbay transportation system according to the present invention.

As shown in FIG. 5, the interbay transportation system of the present embodiment includes a buffer stocker 70 in addition to stockers 10 to 60 provided for respective bays 1 to 6.

Interbay transportation in the interbay transportation system of the present embodiment will be described using FIG. 6.

Figure 6:
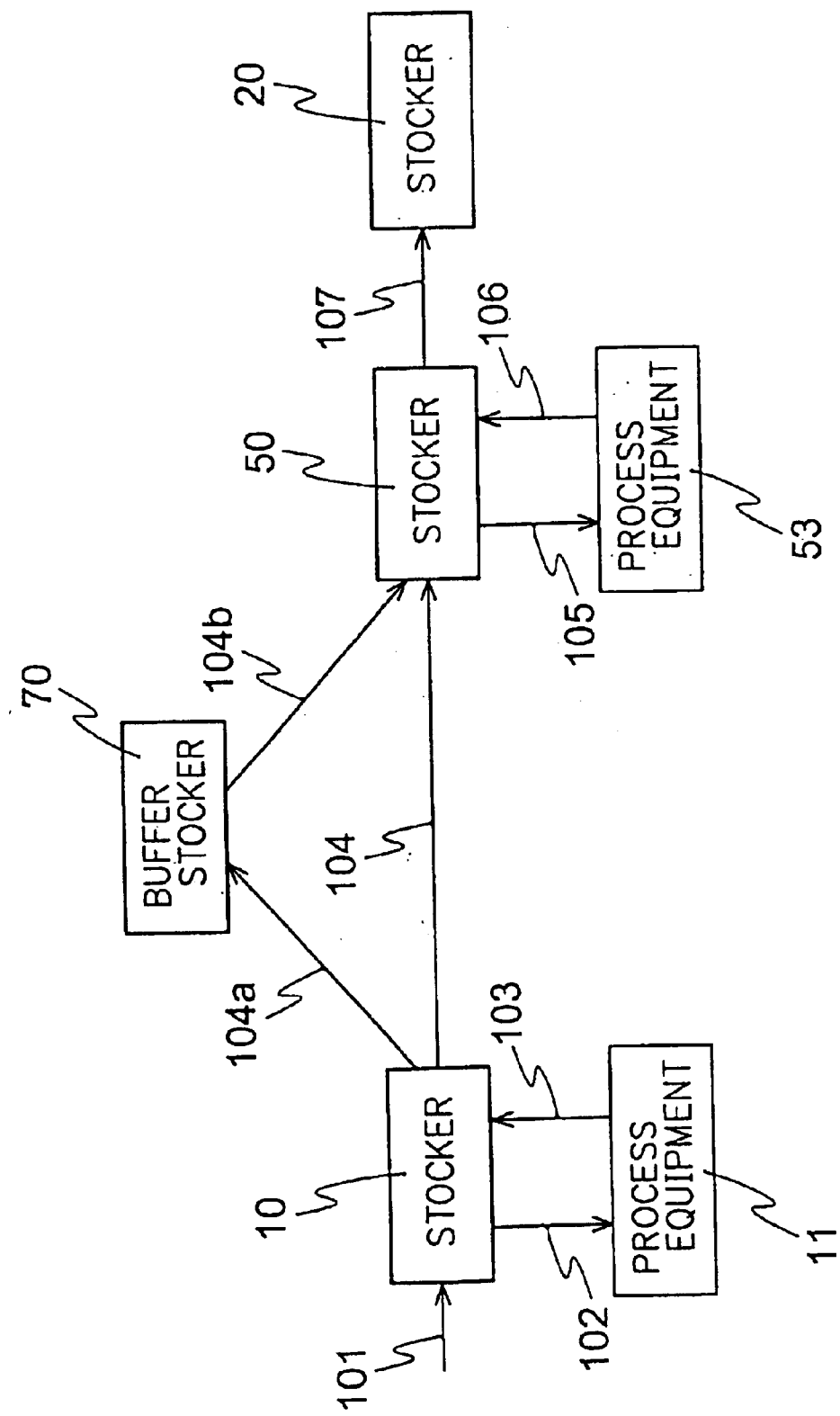
FIG. 6 is a schematic representation showing an interbay transportation according to the present invention.

A pod (semiconductor wafers) to be processed by process equipment 11 is loaded on an OHS vehicle 80, carried to the bay 1, and then stored into the stocker 10 for the bay 1 (see an arrow 101 in FIG. 6). An intrabay transportation system provided in the bay 1 takes out the aforementioned pod from the stocker 10, and feeds the pod into the process equipment 11 (see an arrow 102 in FIG. 6). Upon completion of processing in the process equipment 11, the intrabay transportation system returns the process-completed pod to the stocker 10 (see an arrow 103 in FIG. 6).

Subsequently, the OHS 8 attempts to transport the process-completed pod to the bay 5 for the next process step in process equipment 53 (see an arrow 104 in FIG. 6). At this time, when the stocker 50 for the bay 5 is full for some reasons, the OHS 8 temporarily saves the pod into the buffer stocker 70 (see an arrow 104a in FIG. 6). Thereafter, the number of pods in the stocker 50 is reduced causing the stocker 50 not to be full, the OHS 8 transports the pod saved in the buffer stocker 70 to the stocker 50 (see an arrow 104b in FIG. 6).

An intrabay transportation system in the bay 5 takes out the aforementioned pod from the stocker 50, and then feeds the pod into process equipment 53 (see an arrow 105 in FIG. 6). Upon completion of processing by the process equipment 53, the intrabay transportation system returns the process-completed pod to the stocker 50 (see an arrow 106 in FIG. 6).

The OHS 8 performs a carry-out operation of the process-completed pod from the stocker 50, and then transports the pod to the stocker 20 for the next process step (see an arrow 107 in FIG. 6). Thereafter, in the same manner, transportation of the pod (semiconductor wafers) and processing by the process equipment are iterated, thereby allowing the manufacture of semiconductor products to proceed.

As described above, in the present embodiment described above, the buffer stocker for temporarily saving a pod is provided, and when a stocker for the next process step is full, a pod is saved into the buffer stocker. Consequently, no pod is remain unloaded on the OHS vehicle 80, sop that the OHS vehicle is efficiently used to enable the transportation efficiency to be improved. Furthermore, a pod awaiting transportation to the next process step does not reside in the previous process step, so that the carry-in/carry-out operations at the stocker for the previous process step are not hindered.

Figure 7:
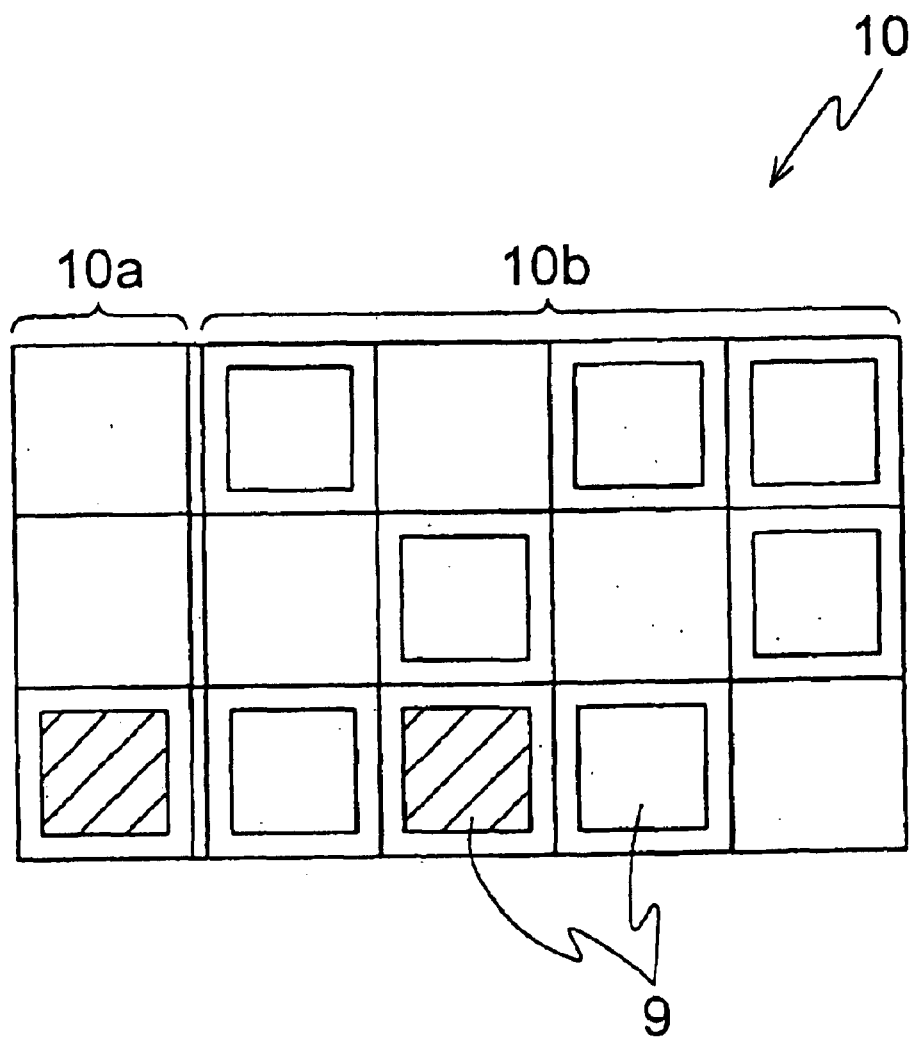
FIG. 7 is a schematic representation of a stocker for a interbay transportation system.

Meanwhile, when a stocker is full, a pod completed in processing by process equipment in the bay cannot be returned to the stocker. In this case, since a pod to follow cannot be fed into the process equipment, a critical state occurs in which no processing can be performed. Therefor, as shown in FIG. 7, each of the stockers is divided into a carry-out area 10a and a common area 10b, and the carry-out area 10a is preserved for a pod to be returned from process equipment in a bay. On the other hand, the common area 10b can be used to store both a process-awaiting pod sent from the previous process step and a process-completed pod returned from the process equipment. In FIG. 7, each process-completed pod is hatched. In the above configuration including the carry-out area and common area, the pod is temporarily saved into the buffer stocker 70 when the common area of the destination stocker is fully occupied.

In addition, in the present embodiment, while description has been made regarding the example in which the dedicated buffer stocker 70 is provided, one or more of the stockers for the bays 1 to 6 may be used also as a buffer stocker(s). In this case, preferably, a stocker(s) to be used as a buffer stocker(s) is predetermined, and a part of the common area in the stocker is preserved as a temporary-saving space. Alternatively, the arrangement may be made such that at each timing, that is, at the time when transportation to the buffer stocker is necessitated, a stocker having a large free space is detected, and the free space in the detected stocker is used as a buffer stocker.

Moreover, a case is conceivable in which, in the next process step, for example, in the bay 5, process equipmentes 51, 52, 53, and 54 each perform a different process. In this case, when the stocker 50 is caused to be full with pods that are to be processed by the process equipmentes 51, 52, and 54, since a pod to be processed by the process equipment 53 cannot be carried therein, so that a wait time occurs in the process equipment 53. To prevent such a situation, it is preferable that a certain free space is kept to always remain in the stocker for the next process step. In this case, an upper limit is preferably set for the number of pods within the stocker for next process step, that is, within the stocker 50. If the number of the pods with in the stocker 50 exceeds the upper limit, the stocker is assumed to be full and a pod to be transported to the stocker is temporally shelved in the buffer stocker.

Furthermore, in the above description, when a stocker for the next process step is full, a pod is transported to the buffer stocker. However, the arrangement may be made such that when process equipment in the next process step is not operating, a pod is transported to the buffer stocker. This arrangement avoids a case where a pod to be processed in a non-operating process equipment resides in a stocker of a bay, and the residing pod hinders the carry-in operation for a pod that is to be processed by another process equipment in the bay.

Embodiment 3

When one of the process equipmentes stops operation for a long time because of, for example, malfuction or maintenance, a case can occur in which a large number of pods (semiconductor wafers) to be processed by the process equipment reside in, for example, the departure stocker and/or the destination stocker, thereby hindering transportation of other pods. Therefore, the present embodiment is characterized in that a buffer stocker is provided to temporarily storing the pods.

Figure 8:
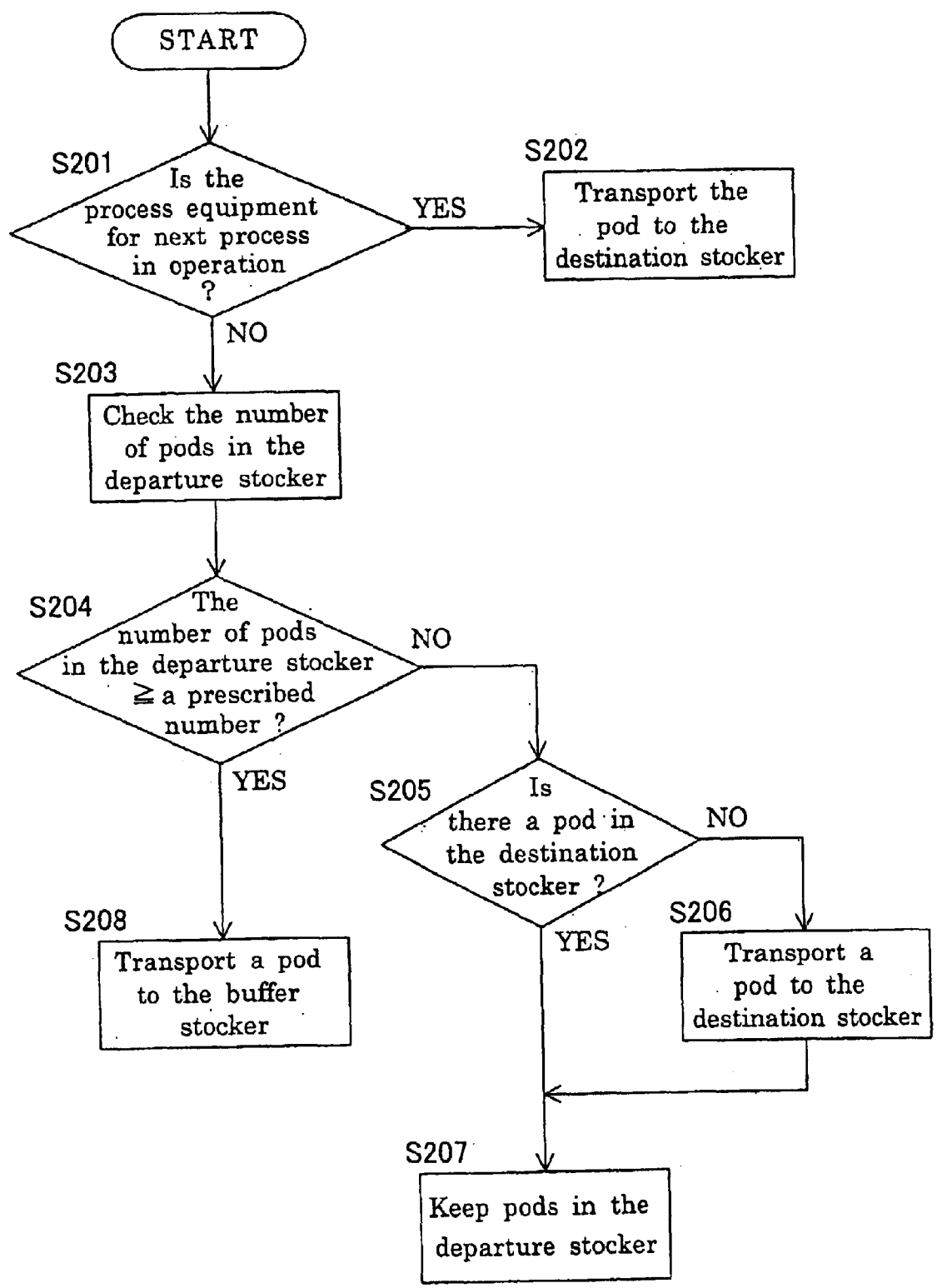
FIG. 8 is a flow chart showing a method of interbay transportation according to the present invention.

Hereinafter, an interbay transportation system of the present embodiment will be described using FIGS. 5 and 8.

As shown in FIG. 5, in addition to stockers 10 to 60 for respective bays 1 to 6, the interbay transportation system of the present embodiment further includes a buffer stocker 70.

Hereinafter, operation of the interbay transportation system according to the present embodiment will be described with reference to a flowchart shown in FIG. 8. Similarly to the above-described Embodiments 1 and 2, a description will be made on assumption that a semiconductor wafer (pod) is first processed by the process equipment 11, and is then processed by the process equipment 53.

After a pod completed in processing by the process equipment 11 has been returned to the stocker 10, information representing that the pod has returned is sent from the stock controller in the stocker 10 to the host computer 100. The host computer 100 having received the information inquires the process equipment controller as to whether the process equipment 53 for the next process step is operating (step S201).

When the process equipment 53 is operating, the pod is transported to the destination stocker, that is, the stocker 50 (step S202). The host computer 100 controls the OHS vehicle 80, and the pod is thereby transported to the stocker 50. In this case, preferably, step S103 and the subsequent steps in the above-described first embodiment (FIG. 5) are executed, and a determination is made as to whether the pod is to be immediately transported or is to be kept in a standby state in the departure stocker for a while.

On the other hand, when the process equipment 53 is not operating, even if the pod is transported thereto, no significant things can be achieved. In addition, other process equipmentes 51, 52, and 54 are operating in the bay 5, which is the same bay where the process equipment 53 belongs. As such, when a pod to be processed by the process equipment 53 is transported to the stocker 50 and is caused to reside therein, the pod can hinder a pod to be processed by the process equipmentes 51, 52 or 54 from being carried therein. Hence, the pod is stored in a standby state in the departure stocker (stocker 10).

However, the storage capacity of the stocker is limited, and in addition, a specific free spacing needs to be preserved for a pod transported from the previous process step and a pod returning after completion in processing by the process equipment 11, 12, and 13. Hence, the host computer 100 measures the number of pods existing in the departure stocker (step S203), and compares the result with a predetermined number (step S204).

If the number of pods in the departure stocker is smaller than the predetermined number, the host computer 100 verifies whether there is a pod in the stocker 50, which is the destination stocker of the pod to be transported (step S205).

If the detination stocker does not contain a pod, the host computer 100 issues a command for transportation of one pod to the destination stocker (step S206). An OHS vehicle transports the pod to the stocker 50, and the process equipment 53 is prepared to resume the operation. In this case, a number of pods meeting a full loading capacity of the OHS vehicle (for example, two pods) may be transported to the destination stocker, thereby improving the transportation efficiency.

On the other hand, if the destination stocker contains a pod, no pod needs to be transported thereto. As such, the host computer 100 does not issue the command for transportation, and controls the pod to be kept in a standby state in the departure stocker (step S207).

After processing of a subsequent pod has been completed in the process equipment 11, the procedure starting with a step S201 is similarly performed for the pod. At this time, if the process equipment 53 has not yet started operation, the aforementioned pod is also kept at a standby state in the departure stocker (step S207). In this way, the number of pods in the departure stocker gradually increases. As a result, at step S204, if the number of pods in the departure stocker is determined to be larger than or equal to the predetermined number, the host computer 100 issues a command for transportation of one pod or pods for one OHS vehicle to the buffer stocker 70 (step S208).

After the above, when the process equipment 53 starts operation, the pod or pods are transported from the buffer stocker to the stocker 50, which is the destination stocker of the pod.

As described above, in the present embodiment, when process equipment for the next process step is not operating, only one pod is transported to the next process step and a remaining pod is kept in a standby state in a stocker for the previous process step. If the number of pods in the stocker for the previous process step reaches larger or equal to the predetermined number, the pod is transferred to the buffer stocker.

Because of the above arrangement, the stocker for the next process step is not caused to be full with pods waiting for operation of the process equipment, hence another pod that uses the same stocker is not hindered from being fed into the other process equipment. Moreover, since at least one pod is transported to the stocker for the next process step, a pod can be quickly fed to quickly start processing after the process equipment resumed. Furthermore, with the buffer stocker being used, the stocker in the previous process step is not caused to be full, so that a pod to be processed therein is not hindered from being carried in and a pod completed in processing therein is not hindered from being carried out. Still furthermore, the buffer stocker is used only in the case where the number of pods in the stocker for a previous process step is larger than or equal to the predetermined number. Therefore, the frequency of direct transportation from a stocker for a previous process step to the stocker for the next step can be increased as many as possible, thereby enabling the transportation efficiency to be improved.

In the present embodiment, description has been made regarding the example in which the dedicated buffer stocker 70 is provided. However, one or more of stockers 10, 20, 30, 40, 50, and 60 may also be used as a buffer stocker. In this case, preferably, a stocker to be used as a buffer stocker is predetermined, and a part of the common area in the stocker is preserved as a temporary-saving space. Alternatively, the arrangement may be made such that at each timing, that is, at the time where transportation to the buffer stocker is required, a stocker having a large free space is detected, and the free space in the detected stocker is used as a buffer stocker.

In the above-described step S205, while only the determination is made whether there is a pod in the destination stocker 50, no determination is made as to which one of the process equipment is to process the pod stored in the stocker 50. That is, in the case where a pod to be processed by, for example, process equipment 51 exists in the stocker 50, further pod does not transported to the stocker 50 even if the pod is to be processed by process equipment 53 not by process equipment 51. However, at process step S205, when a pod to be processed by, for example, the process equipment 53 does not exist in the stocker 50, a pod for the process equipment 53 may be transported from the departure stocker regardless of existence/nonexistence of another pod. Thereby, at least one pod is secured for all the process equipment, so that a pod can be quickly fed and processing can be quickly started after the process equipment has started operation.

Embodiment 4

A case is conceivable in which when transportation is attempted for a pod completed in a previous process step to the next process step, the transportation is impossible because the stocker for the next process step is full. Therefore, the present embodiment is characterized in that transportation is performed considering space of the stocker for the next process step and a time until a free space becomes available.

Figure 9:
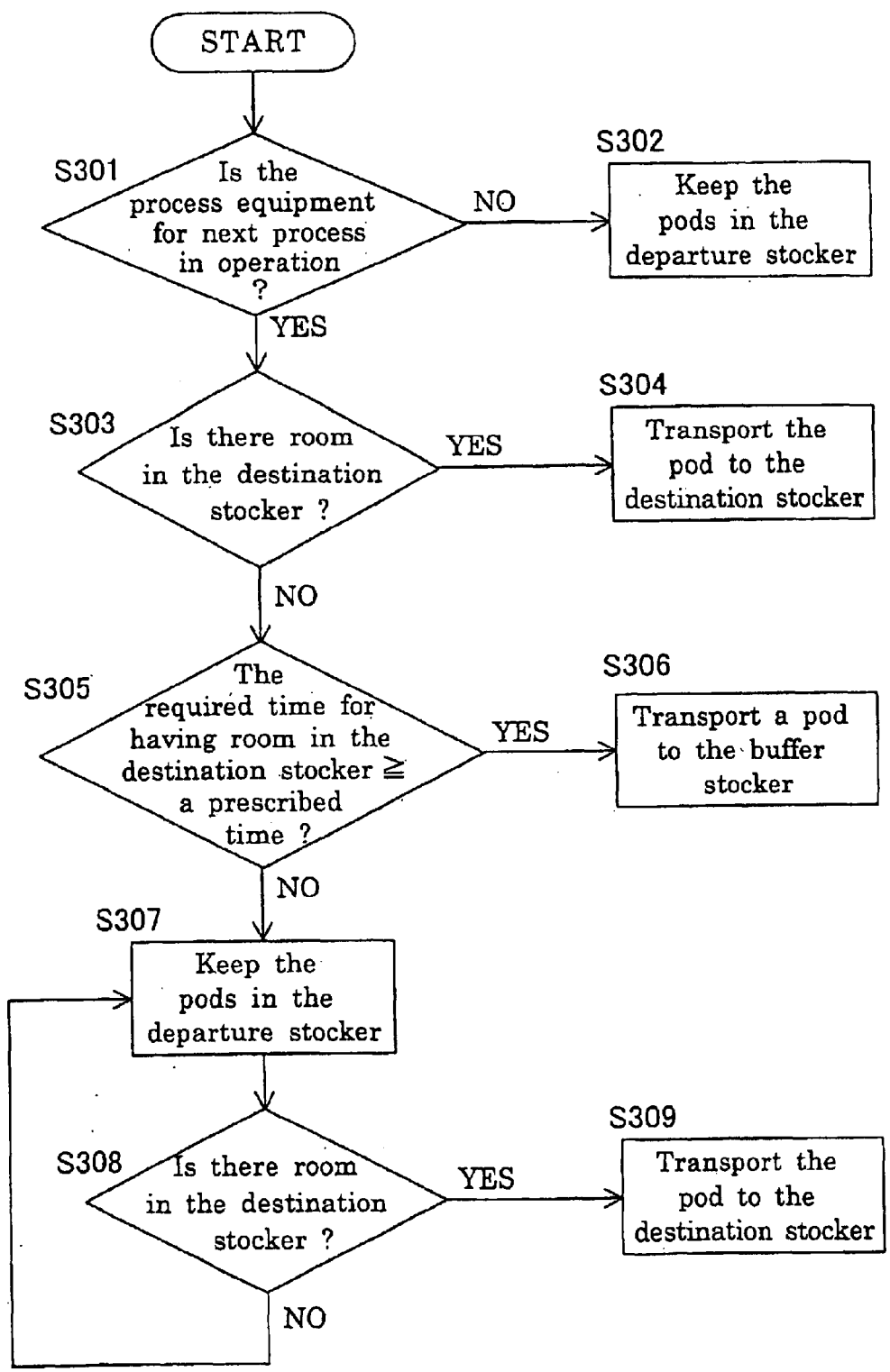
FIG. 9 is a flow chart showing a method of interbay transportation according to the present invention.

Hereinafter, an interbay transportation system of the present embodiment will be described using FIGS. 5 and 9.

As shown in FIG. 5, in addition to stockers 10 to 60 for respective bays 1 to 6, the interbay transportation system according to the present embodiment further includes the buffer stocker 70.

Hereinafter, operation of the interbay transportation system according to the present embodiment will be described with reference to a flowchart shown in FIG. 9. Similarly to the above-described Embodiments 1, 2, and 3, a description will be made on assumption that a semiconductor wafer (pod) is first processed by the process equipment 11, and is then processed by the process equipment 53.

After a pod completed in processing by the process equipment 11 has been returned to the stocker 10, information representing that the pod has returned is sent from the stock controller in the stocker 10 to the host computer 100. The host computer 100 having received the information inquires the process equipment controller as to whether the process equipment 53 in the next process step is operating (step S301).

In the case where the process equipment 53 is not operating, even if a pod is transported thereto, no significant things can be achieved. Therefore, the pod is kept in a standby state in the departure stocker (stocker 10) (step S302). As already described above, since the storage capacity of the stocker is limited, a determination is preferably made whether the pod is to be transported to the buffer stocker or is to be kept to remain in the departure stocker following the step S203 and the subsequent steps in the Embodiment 2 shown in FIG. 7.

On the other hand, when the process equipment 53 is operating, the host computer 100 verifies whether a free space exists in the destination stocker 50 (step S303).

If a free space exists in the destination stocker, the host computer 100 issues a command for transportation of the aforementioned pod to the destination stocker (step S304).

If no free space exists in the destination stocker, the host computer 100 computes a time until which a free space becomes available in the destination stocker, and compares the result to a predetermined time (step S305). The predetermined time is determined as a difference in time between detour transportation via the buffer stocker and direct transportation to destination stocker. That is, the predetermined time is expressed as [(required time for transportation from the departure stocker to the buffer stocker)+(required time for transportation from the buffer stocker to the destination stocker)−(required time for transportation from the departure stocker to the destination stocker)].

As a result of the comparison, if the time until which a free space becomes available in the destination stocker is longer, the host computer 100 issues a command for transportation of the pod to the buffer stocker (step S306). The host computer 100 controls the OHS vehicle 80, and the pod is thereby transported to the buffer stocker.

On the other hand, if the time until free space becomes available in the destination stocker is shorter, the host computer 100 does not issue the command for transportation, and controls the pod to be kept in a standby state in the departure stocker (step S307).

After the above, according to information from the stock controller or through making an inquiry to the stock controller, the host computer 100 verifies whether a free space has become available (step S308). When a free space has become available, the host computer 100 issues a command for transportation of the pod to the destination stocker (step S309).

In the present embodiment as described above, a time until which a free space becomes available in the destination stocker is computed, and then determines whether a pod is transported to the buffer stocker or the pod is kept in a standby state in the departure stocker. Accordingly, a case can be avoided in which a free space occurs immediately after a pod is sent toward the buffer stocker, so that the pod can be transported to the destination stocker in a shortest time. Consequently, occurrence of redundant transportation is minimized to improve the efficiency in transportation. Furthermore, the time required for the manufacture of a semiconductor product can also be reduced through the reduction in transportation time.

Suppose the OHS vehicle 80 is capable of loading a plurality of pods (for example, two pods). In this case, determinations may be made as to whether free rooms for two pods are available in the destination stocker, and how long does it take until free rooms for two pod become available. Upon the determinations, the pods are transported to the destination stocker, or transported to the buffer stocker, or kept in a standby state in the From-stocker. The loading capacity of the OHS vehicle can be fully utilized and the transportation efficiency can be further improved.

In addition, a case can be conceivable in which a certain amount of free space is desired to always remain in the destination stocker. In this case, preferably, an upper limit is provided for the number of pods to be stored in the destination stocker, and determinations are made for the existence of free space with respect to the upper limit value and for the time until which a free space becomes available.

In the above-described Embodiments 1 to 4, description has been made regarding the examples in which the OHS vehicle travels along circular guide rail having no junction or branch. However, the interbay transportation system and the interbay transportation method according to the present invention may be adapted to a case where junctions or branches is provided or a case where two or more guide rails are provided in parallel. Moreover, description has been made regarding examples in which the pod is transferred from the stocker 10 to the stocker 50. As a matter of course, however, the interbay transportation system and the interbay transportation method according to the present invention may be adapted to transportation between other stockers.

While preferred embodiments of the present invention have been described, such descriptions are for illustrative purposes only, and it is to be understood that changes and variations may be made without departing from the sprit or scope of the present invention.

What is claimed is:

1. A method of interbay transportation for an interbay transportation system comprising bays in which process equipment are provided, stockers respectively provided for each of the bays, and a vehicle for loading a plurality of semi-processed products and transporting semi-processed products from the stocker of the bay including the process equipment for performing a previous process step to the stocker of the bay including the process equipment for performing the next process step, the method including comparing a time of completion of processing in the process equipment for the previous process step and a time of transportation between the stockers, delaying transportation by the vehicle until the time of completion of processing becomes equal to the time of transportation between the stockers, and transporting semi-processed products that were completed in processing in the previous process step, during the period of delay, to the stocker for the next process step at one time.

2. A method of interbay transportation for an interbay transportation system comprising bays in which process equipment are provided, stockers respectively provided for each of the bays, a vehicle for loading a plurality of semi-processed products, and a buffer stocker in which semi-processed products are temporarily shelved, the vehicle transporting semi-processed products from the stocker of the bay including the process equipment for performing a previous process step to the stocker of the bay including the process equipment for performing the next process step, and to the buffer stocker in which semi-processed product is temporary shelved, a semi-processed product to be transported to the stocker for the next process step being temporarily held in the buffer stocker, the method comprising, when the number of semi-processed products in the stocker for the next process step is at least a predetermined number, comparing the time until the number of semi-processed products in the stocker for the next process step becomes smaller than the predetermined number to a time difference between a time of transportation via the buffer stocker and a time of direct transportation to the stocker for the next process step, and, when the time until the number of semi-processed products becomes smaller than the predetermined number is longer than the time difference, transporting a semi-processed product to the buffer stocker.

* * * * *